US007086025B1

(12) United States Patent
Yang (10) Patent No.: US 7,086,025 B1
(45) Date of Patent: Aug. 1, 2006

(54) PROGRAMMABLE LOGIC DEVICE PARTITIONING METHOD FOR APPLICATION SPECIFIC INTEGRATED CIRCUIT PROTOTYPING (75) Inventor: Honda Yang, Saratoga, CA (US)

(73) Assignee: Adaptec, Inc., Milpitas, CA (US)

( * ) Notice: Subject to any disclaimer, the term of this patent is extended or adjusted under 35 U.S.C. 154(b) by 252 days.

(21) Appl. No.: 10/693,285

(22) Filed: Oct. 23, 2003

(51) Int. Cl.
G06F 17/50 (2006.01)

(52) U.S. Cl. ............... 716/8; 716/2; 716/7; 716/16; 326/38; 326/39; 326/41; 326/47

(58) Field of Classification Search ............... 716/1, 716/3, 4, 6, 8, 12, 16, 17, 18, 2, 7; 714/39, 714/739; 713/400; 710/104, 305; 709/250; 703/14, 28; 370/351, 395.1; 326/38, 39, 326/41, 47; 257/232
See application file for complete search history.

(56) References Cited

U.S. PATENT DOCUMENTS

| | | | |
|---|---|---|---|
| 5,649,176 A * | 7/1997 | Selvidge et al. ............. 713/400 |
| 5,687,325 A * | 11/1997 | Chang .......................... 710/104 |
| 5,761,484 A * | 6/1998 | Agarwal et al. ............... 716/16 |
| 5,867,037 A * | 2/1999 | Capps et al. .................... 326/38 |
| 6,009,531 A * | 12/1999 | Selvidge et al. ............. 713/400 |
| 6,321,366 B1 * | 11/2001 | Tseng et al. ..................... 716/6 |
| 6,377,912 B1 * | 4/2002 | Sample et al. ................. 703/28 |
| 6,389,379 B1 * | 5/2002 | Lin et al. ....................... 703/14 |
| 6,389,558 B1 * | 5/2002 | Herrmann et al. ............ 714/39 |
| 6,496,971 B1 * | 12/2002 | Lesea et al. ................... 716/16 |
| 6,748,456 B1 * | 6/2004 | Stanton et al. ................. 710/1 |
| 6,785,873 B1 * | 8/2004 | Tseng ............................. 716/4 |
| 6,798,239 B1 * | 9/2004 | Douglass et al. ............. 326/39 |
| 6,839,888 B1 * | 1/2005 | Gupta ........................... 716/16 |
| 6,857,110 B1 * | 2/2005 | Rupp et al. ..................... 716/4 |
| 6,892,337 B1 * | 5/2005 | Brophy et al. ............... 714/739 |
| 2003/0103509 A1 * | 6/2003 | Kendall et al. ........... 370/395.1 |
| 2003/0126296 A1 * | 7/2003 | Aviles ......................... 709/250 |
| 2003/0217215 A1 * | 11/2003 | Taborek et al. ............. 710/305 |
| 2004/0054976 A1 * | 3/2004 | Takahashi et al. ............. 716/8 |
| 2004/0060032 A1 * | 3/2004 | McCubbrey ................. 716/16 |
| 2005/0018650 A1 * | 1/2005 | Dropps et al. .............. 370/351 |

OTHER PUBLICATIONS

Adaos et al., "Efficient implementation of a serial/parallel multiplier for IP based development and rapid prototyping in VLSI digital signal processing", Sep. 5-8, 1999, The 6th IEEE International Conference on,vol. 1, Page(s):33-36 vol. 1.*

(Continued)

Primary Examiner—Vuthe Siek
Assistant Examiner—Helen Rossoshek
(74) Attorney, Agent, or Firm—Gunnison, McKay & Hodgson, L.L.P.; Forrest Gunnison (57) ABSTRACT The interconnect pin count between field programmable gate arrays (FPGAS) used in prototyping an application specific integrated circuit (ASIC) is reduced without compromising the prototyping by using serial links between the FPGAs. A block A of the ASIC is programmed in a first FPGA. A block B of the ASIC is programmed in a second FPGA. Blocks A and B are identical between ASIC and FPGA implementations. Block A communicates with block B via two interconnected wrappers, which are, in this example, serial COM wrappers connected by a serial link.

10 Claims, 8 Drawing Sheets

OTHER PUBLICATIONS

Kuo et al., "Integrated FPGA based ASIC design on error code correction counter for UPS telecommunication", Oct. 22-25, 2001Power Electronics and Drive Systems, Proceedings., 4th IEEE International Conference on, vol. 2, Page(s):512-516.*

Abid te al., "Rapid prototyping environment for design of hardware/software electronic systems", Sep. 7-10, 1998, Electronics, Circuits and Systems, IEEE International Conference on,vol. 1, Page(s):531-535.*

Thompson et al., "A 300 MHz BiCMOS serial data transceiver", May 9-12, 1993, Custom Integrated Circuits Conference, 1993., Proceedings of the IEEE,Page(s):16.7.1-16.7.5.*

* cited by examiner

PROGRAMMABLE LOGIC DEVICE PARTITIONING METHOD FOR APPLICATION SPECIFIC INTEGRATED CIRCUIT PROTOTYPING

BACKGROUND OF THE INVENTION

1. Field of the Invention

The present invention relates generally to application specific integrated circuit prototyping, and more particularly to partitioning an ASIC into multiple programmable logic devices.

2. Description of Related Art

Typically, a field programmable gate array (FPGA) was used in prototyping an application specific integrated circuit (ASIC). However, a complex ASIC does not fit into a single FPGA despite the fact that FPGA capacity has grown exponentially in recent years.

To prototype a complex ASIC design, multiple FPGAs, typically mounted on a printed circuit board, must be used. When different blocks of the ASIC are programmed in different FPGAs, the interface signals between the ASIC blocks become chip-to-chip interconnects on the printed circuit board.

Figure 1:
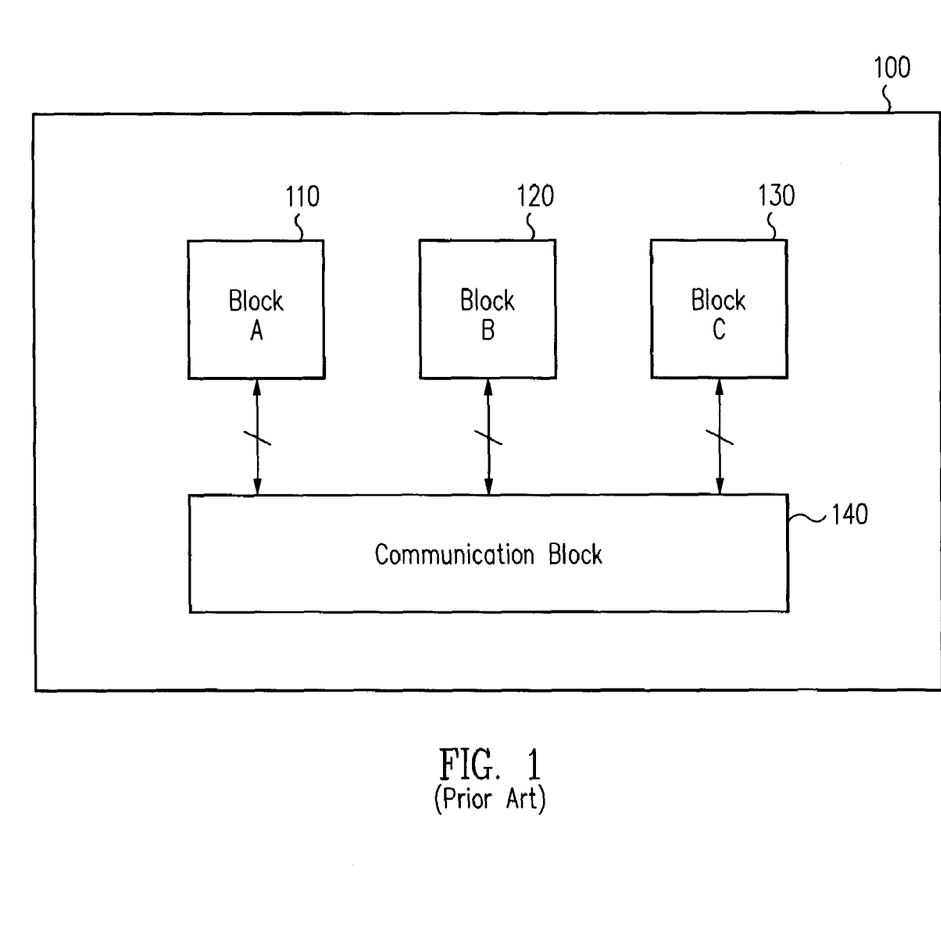
FIG. 1 is a block diagram of an application specific integrated circuit (ASIC).

FIG. 1 is a block diagram of a block-based ASIC architecture with block A 110, block B 120, and block C 130 communicating with each other via a communication block 140. Communication block 140 could be a switch fabric or a bus.

Block A 110, block B 120, and block C 130 typically share a common interface protocol to communicate with communication block 140. If, for example, communication block 140 is a PCI bus, block A 110, block B 120, and block C 130 all have the same PCI interface logic.

Unfortunately, the number of interface signals between the ASIC blocks can easily exceed the FPGA package pin count. In cases where the FPGA package pin count is sufficient, the signal routing on the printed circuit board becomes very difficult and expensive. If there is a logic error in programming one of the FPGAs, it may be necessary to redo the signal routing on the printed circuit board, which adds further delay and cost. Hence, as ASICs become more complex, the use of FPGAs to prototype an ASIC is becoming more difficult and expensive.

SUMMARY OF THE INVENTION

According to one embodiment of the present invention, the interconnect pin count between programmable logic devices, such as field programmable gate arrays (FPGAs), used in prototyping an application specific integrated circuit (ASIC) is reduced without compromising the prototyping. This reduction reduces the complexity in printed circuit board signal routing.

In one embodiment, to prototype an application specific integrated circuit that includes a plurality of blocks, a first block of the application specific integrated circuit is placed in a first programmable logic device. The first block generates a plurality of parallel output signals that are a plurality of input signals for a second block.

The second block of the application specific integrated circuit is placed in a second programmable logic device. The first and second blocks are the same as those in the ASIC being prototyped.

A first serial COM wrapper, in the first programmable logic device, is used to convert the plurality of parallel output signals to a serial data stream. A second serial COM wrapper, in the second programmable logic device, is used to convert the serial data stream to the plurality of parallel input signals for the second block.

In one embodiment, the first serial COM wrapper includes a serializer that, in turn, includes at least one serializer unit. For example, the serializer uses a plurality of n serializer units. Each serializer unit in the plurality of n serializer units processes a different set of output signals in the plurality of parallel output signals to create a serial data stream so that a plurality of n serial data streams are created.

In this embodiment, the second serial COM wrapper includes a deserializer unit that, in turn, includes at least one deserializer unit. For the n serializer units, a plurality of n deserializer units is used. Each deserializer unit in the plurality of n deserializer units processes a different serial data stream in the plurality of n serial data streams.

In another embodiment, in a first programmable logic device, e.g., a field programmable gate array, containing a block of an application specific integrated circuit being prototyped, a plurality of output signals are processed using a serial COM wrapper to generate at least one serial data stream. The at least one serial data stream is passed over a serial link to a second serial COM wrapper in a second programmable logic device containing another block of the application specific integrated circuit being prototyped. The use of serial data links in the prototyping reduces the programmable logic device pin count required to support communication between the ASIC blocks. As noted above, this reduces the complexity of the traces on a printed circuit board. The reduced pin count also makes it easier to implement complex ASIC blocks in a device without having to modify the signal interface because sufficient pins are unavailable to support the signal interface.

Thus, in one embodiment, a structure includes a printed circuit board. A first programmable logic device, e.g., a field programmable gate array, is coupled to the printed circuit board.

The first programmable logic device includes a pin and a block of an application specific integrated circuit being prototyped. The block generates a plurality of output signals. The first programmable logic device also includes a serial COM wrapper coupled to the block to receive the plurality of parallel output signals, and coupled to the pin.

A second programmable logic device is also coupled to the printed circuit board. The second programmable logic device includes another pin and another block of the application specific integrated circuit being prototyped. The second programmable logic device also includes another serial COM wrapper coupled to the another block to provide a plurality of parallel input signals, and coupled to the another pin. A trace on the printed circuit board couples the pin to the another pin.

The serial COM wrapper includes a serializer that in turn includes at least one serializer unit. In one embodiment the serializer includes a plurality of serializer units. Each serializer unit is coupled to receive a different set of output signals in the plurality of output signals.

The another serial COM wrapper includes a deserializer that in turn includes at least one deserializer unit. In one embodiment, the deserializer unit includes a plurality of deserializer units. Each deserializer unit is coupled to receive a different serial data stream.

BRIEF DESCRIPTION OF THE DRAWINGS

FIG. 7 is a key to FIGS. 7A and 7B, which are a signal-timing diagram for the serializer unit of FIG. 4 and the deserializer unit of FIG. 6 according to one embodiment of the present invention.

In the following description, the first digit of reference numeral is the figure number of the figure in which the element having that reference numeral first appeared. Elements with the same reference numeral are the same or equivalent elements.

DETAILED DESCRIPTION

According to one embodiment of the present invention, the interconnect pin count between field programmable gate arrays (FPGAs) used in prototyping an application specific integrated circuit (ASIC) is reduced without compromising the prototyping. The reduction in interface pin count reduces the complexity in printed circuit board signal routing, and eliminates the need to redo the printed circuit board signal routing if a logic error in programming a FPGA requires a change to the signal interface. As explained more completely below, such problems are handled within the FPGA and so do not affect the printed circuit board signal routing. Herein, a FPGA is an example of a programmable logic device, and is not intended to limit the invention to only implementations using FPGAs.

The reduction in interface pin count is achieved by adding a wrapper to FPGAs used in the ASIC prototyping. As used herein, a wrapper is used to denote an extra layer of logic on top of the core logic, which is, for example, a block of the ASIC.

Figure 2:
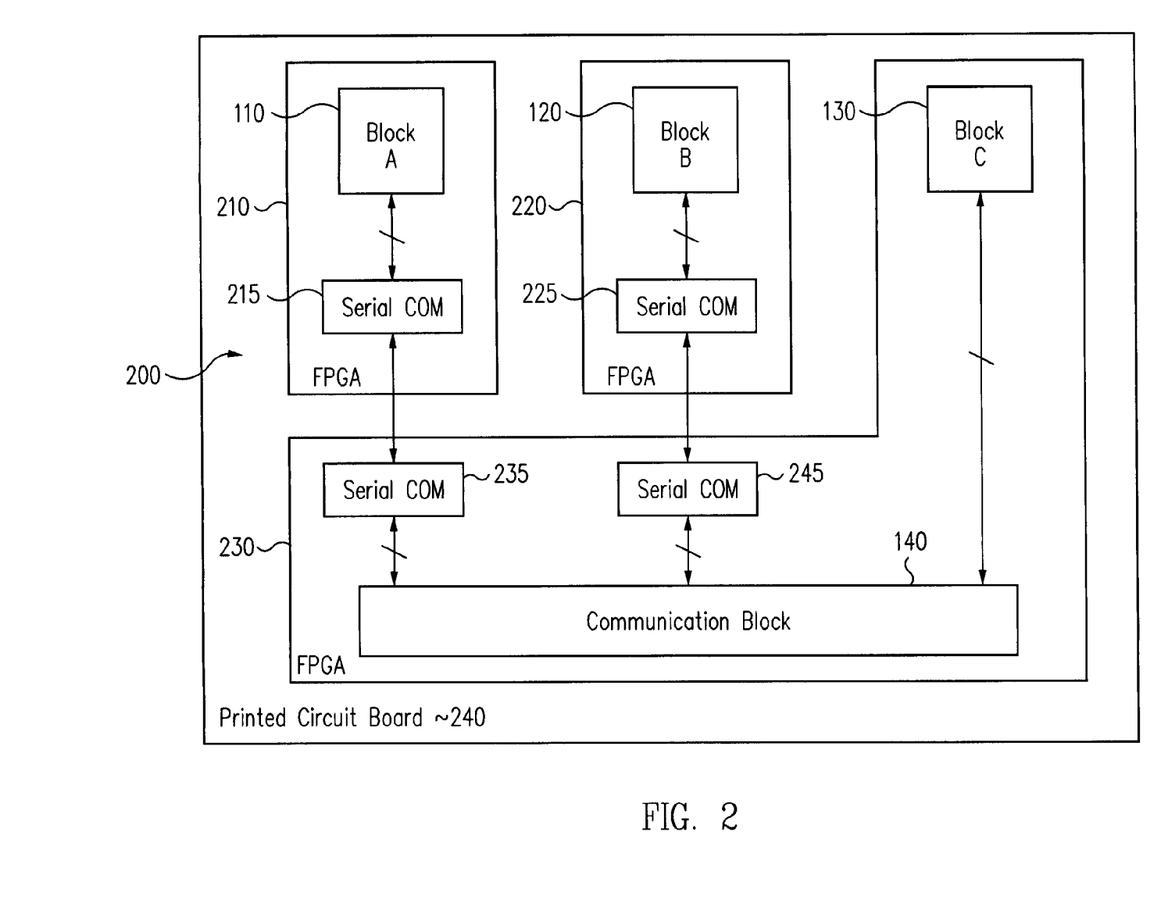
FIG. 2 is a block diagram of a prototype of an ASIC according to one embodiment of the present invention.

FIG. 2 is a block diagram of a system 200 that is used to prototype ASIC 100. Block A 110 is programmed in a first FPGA 210, e.g., placed in first FPGA 210. Block B 120 is programmed in a second FPGA 220. Block C 130 and communication block 140 are programmed in a third FPGA 230. Those of skill in the art know methods for programming programmable logic devices, and in particular FPGAs.

One advantage of this method is readily apparent. ASIC blocks 110, 120, and 130 remain untouched irrespective of the pin counts of FPGAs 210, 220, and 230, respectively. Blocks 110, 120, and 130 are identical between ASIC and FPGA implementations. However, as explained more completely below, serial COM wrappers are used to couple ASIC blocks that are prototyped in different FPGAs. The serial COM wrappers introduce signal delays in addition to the normal signal delays associated with the ASIC design being prototyped. The ASIC design is assumed such that the ASIC design is able to accommodate the extra signal delays introduced by the serial COM wrappers. For ASIC designs that cannot accommodate the extra signal delays, the novel prototyping method of this invention should not be used.

More specifically, block A 110 and communication block 140 communicate via two interconnected wrappers 215 and 235, which are, in this example, serial COM wrappers 215 and 235. Similarly, block B 120 and communication block 140 communicate via two interconnected wrappers 225 and 245, which are, in this example, serial COM wrappers 225 and 245.

Hence, the interconnects, on printed circuit board 240 between FPGA 210 and FPGA 230, which are used to carry signals between block A 110 and communication block 140, are serial links as are the interconnects, on printed circuit board 240 between FPGA 220 and FPGA 230, which are used to carry signals between block B 120 and communication block 140. The use of serial links reduces the FPGA interconnect pin count.

The protocol used for interconnecting two serial COM wrappers is flexible, because the protocol is a private interface. The protocol is optimized for different designs of printed circuit board 240 and for different FPGA pin count restraints.

In this embodiment, each serial COM wrapper includes a transmit serializer and a receive deserializer, e.g., serializer 331 (FIG. 3) and deserializer 342 of serial COM wrapper 215 and serializer 332 and deserializer 341 of serial COM wrapper 235. Each serializer includes at least one serializer unit. The serializer unit receives a defined number of parallel data bits as parallel input signals and converts the parallel input signals to an output serial data bit stream. The defined number of parallel data bits mainly depends on (i) the maximum transmission frequency on a printed circuit board serial link without signal integrity issues and (ii) the constraints imposed by the FPGA pin count.

The serializer unit does not need to understand the parallel communication protocol inside the ASIC being prototyped. The serializer unit simply groups the defined number of parallel data bits and serializes that defined number of parallel data bits.

Each deserializer includes at least one deserializer unit. The deserializer unit receives the serial data bit stream and converts each set of the defined number of serial data bits to a parallel format.

Figure 3:
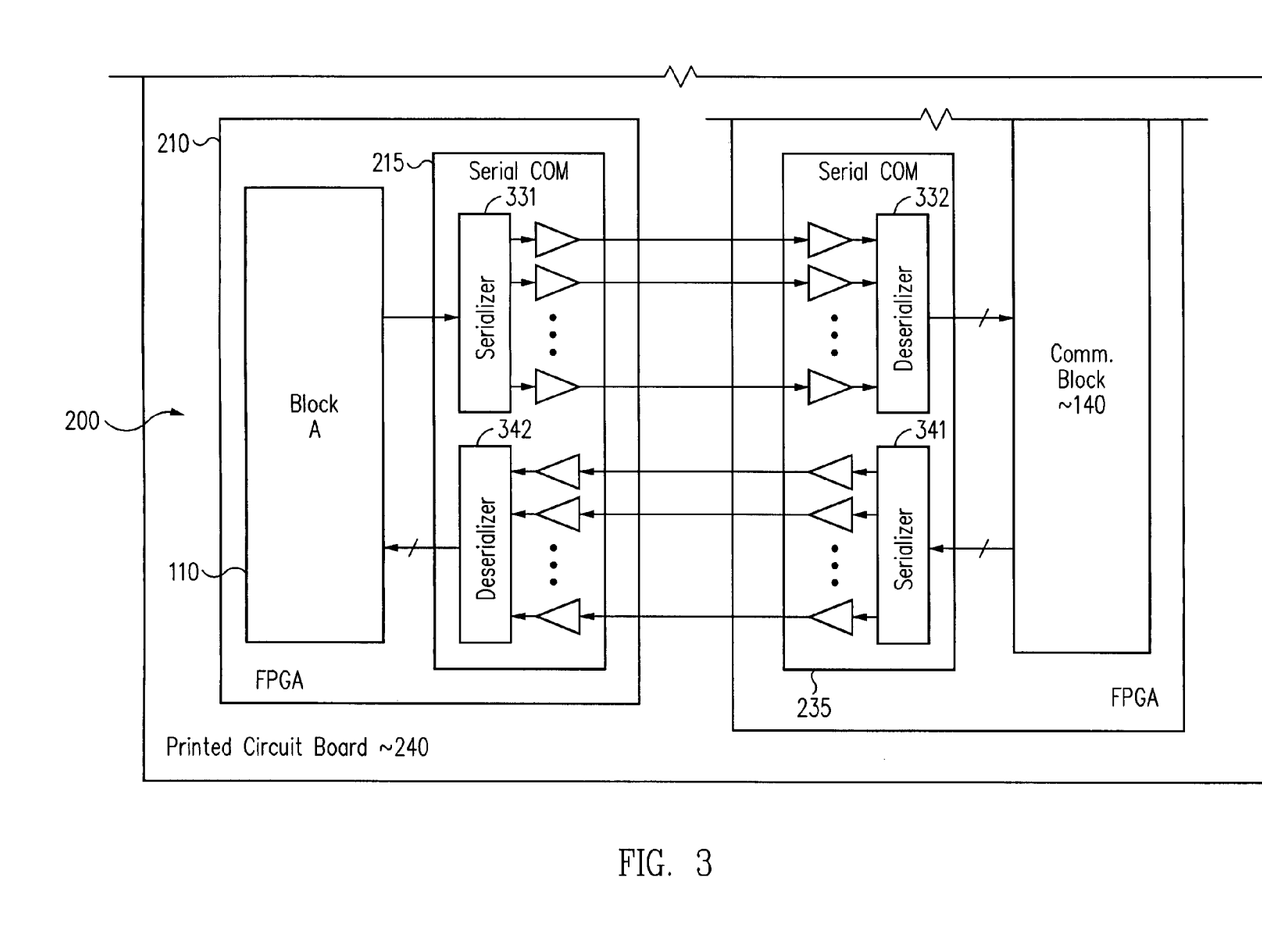
FIG. 3 is a more detail block diagram of a portion of a prototype of an ASIC according to one embodiment of the present invention.

Pairs of a serializer unit and a deserializer unit are bundled to form a wider serial data link as needed to support the bandwidth requirements. FIG. 3 has a serializer 331, 341 with n serializer units and a deserializer 332, 442 with n deserializer units.

Each serializer unit is coupled to the ASIC block to receive a different set of parallel data signals in a plurality of parallel output data signals. Each serializer unit is also coupled to a different pin of the FPGA, containing the ASIC block and the serializer unit, to provide a serial data stream.

Each deserializer unit is coupled to the ASIC block to provide a different set of parallel data input signals in a plurality of input parallel data signals. Each deserializer unit is also coupled to a different pin of the FPGA, containing the ASIC block and the deserializer unit, to receive a serial data stream.

A pin coupled to a serializer unit in one FPGA is coupled to another pin of another FPGA that in turn is coupled to a deserializer unit in the another FPGA. The pin and the another pin are coupled by a serial link that in one embodiment is a trace on the printed circuit board.

For a clock forwarding technique, the serial data, a clock, and a frame signal are forwarded from the serializer to the deserializer. To further increase the data transfer rate across the serial link, the serial data is transmitted on both edges of the clock, the so-called double data rate (DDR) signaling.

Figure 4:
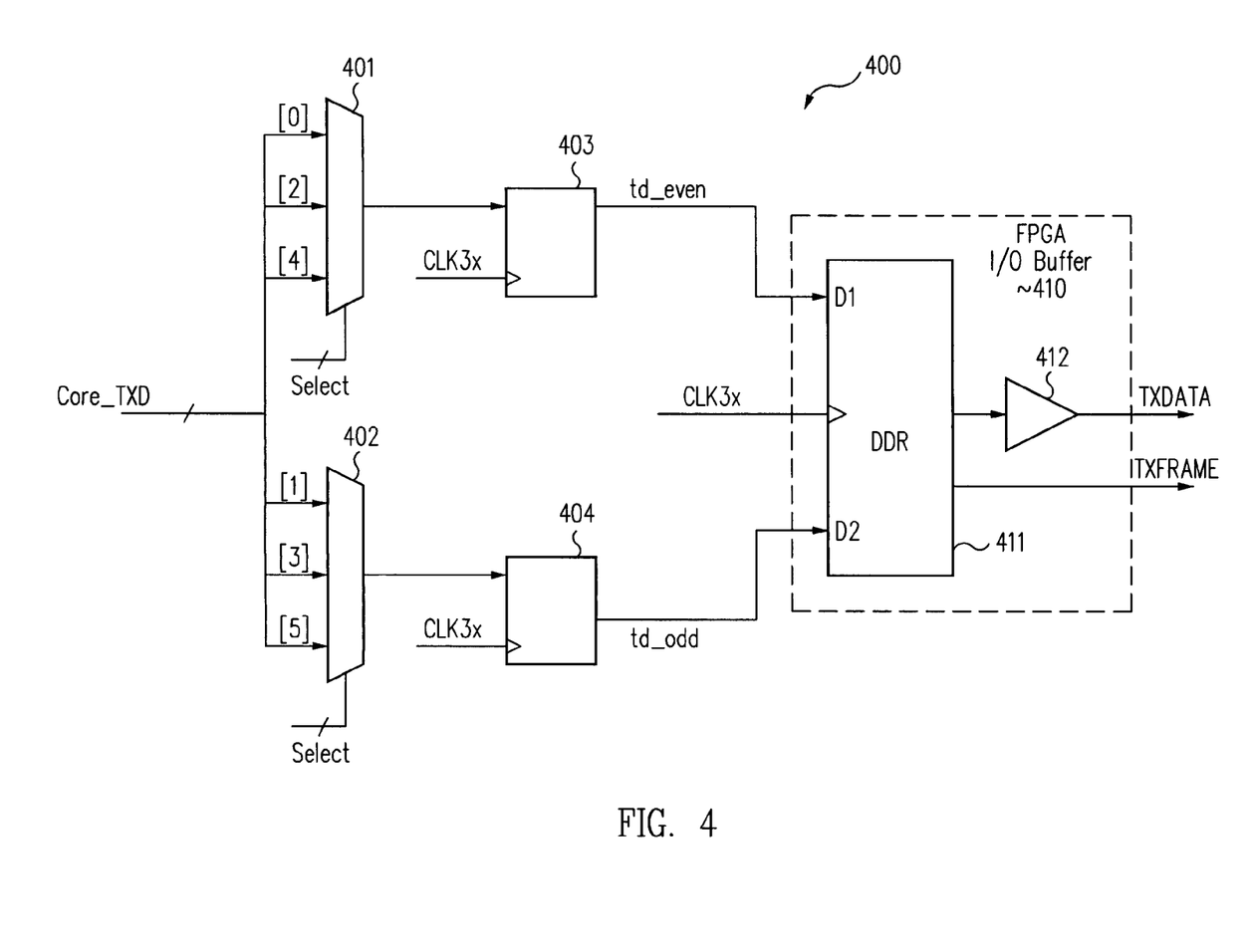
FIG. 4 is a schematic of a serializer unit that can be used in FIGS. 2 and 3 according to one embodiment of the present invention.
Figure 5:
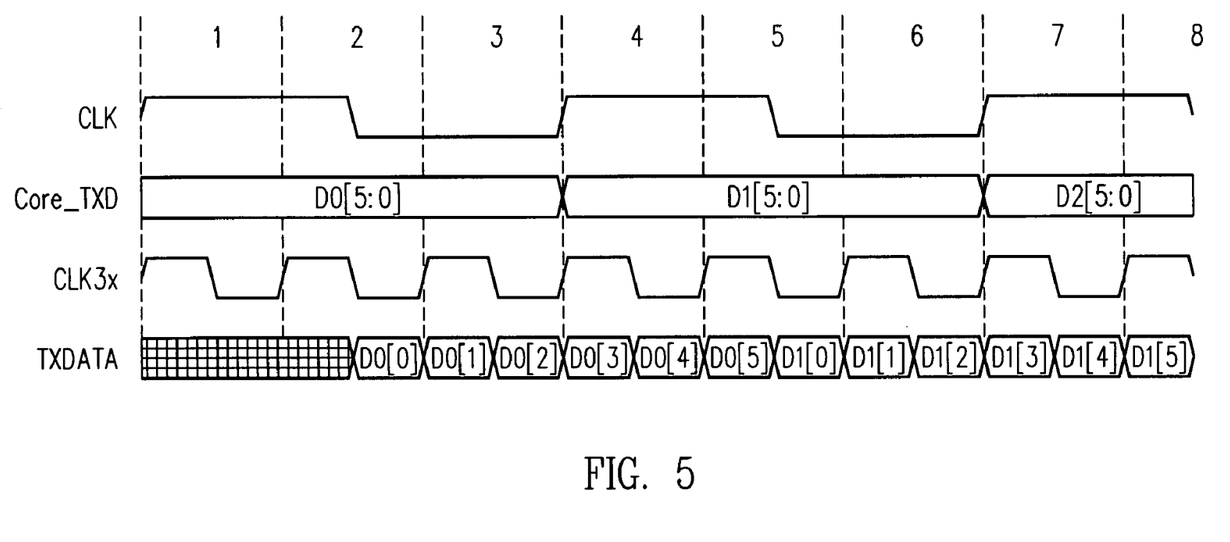
FIG. 5 is a signal-timing diagram for the serializer unit of FIG. 4 according to one embodiment of the present invention.
Figure 7A:
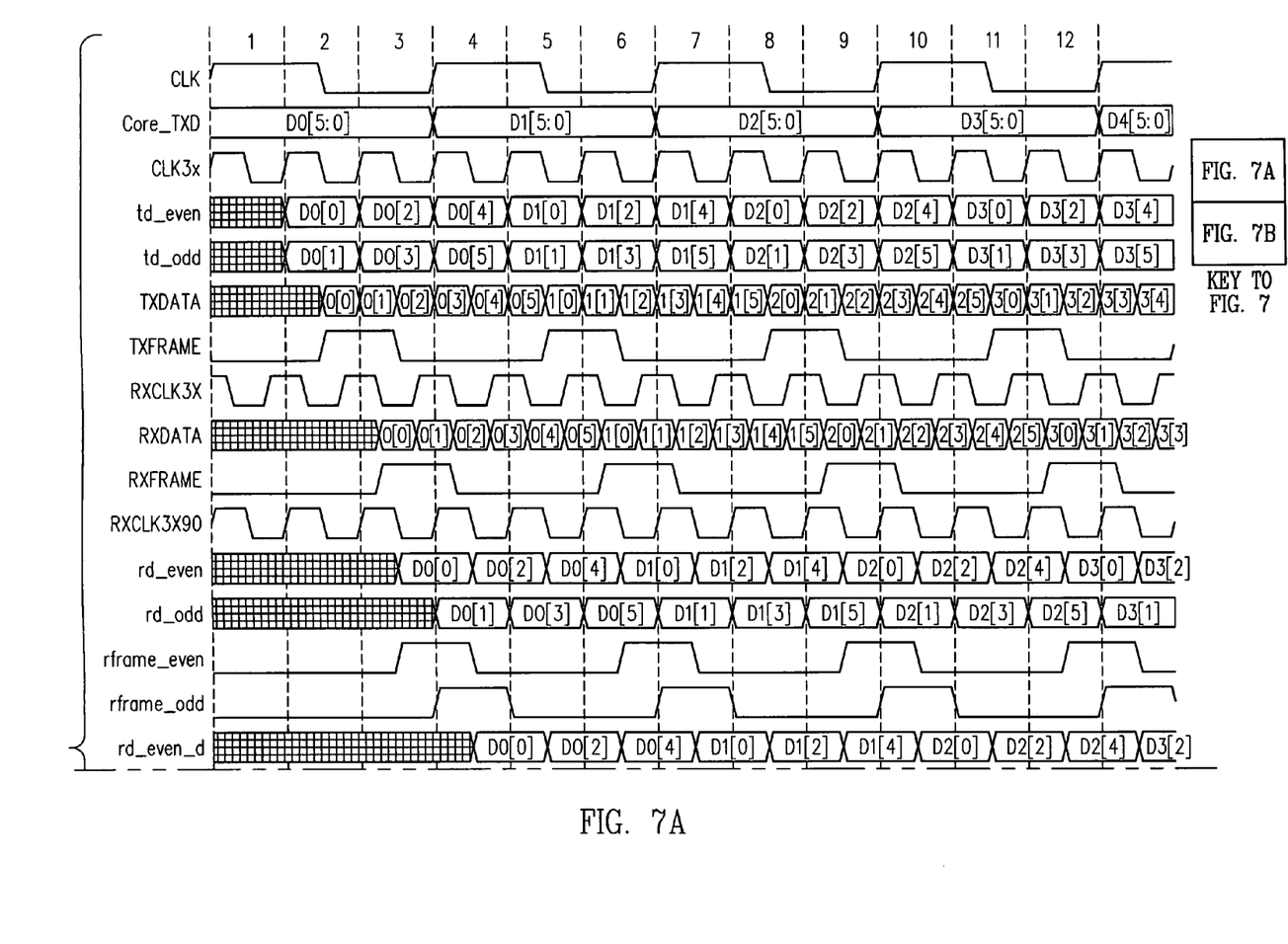

FIG. 4 is an example of a serializer unit 400. In this example, system 200 has a core clock signal CLK (FIGS. 5 and 7A) that clocks core transmit data CORE_TXD (FIGS. 4, 5 and 7A). In this example, the defined number of data bits is six.

The lines carrying the even-numbered bits [0], [2], and [4] are each connected to a different input terminal of a first multiplexer 401. The lines carrying the odd-numbered bits [1], [3], and [5] are each connected to a different input terminal of a second multiplexer 402.

A signal on select line Select to multiplexer 401 and multiplexer 402 determines which data bits are passed through the two multiplexers. In this embodiment, the select signal selects the bits in ascending order and after the highest numbered data bit has been selected starts over with the lowest numbered data bit in the next six bits of data.

An output line of multiplexer 401 is connected to an input terminal of a first register 403. A clock terminal of register 403 is a connect to a clock line CLK3$x$ (FIGS. 5 and 7A) that supplies a clock that has a frequency three times (the predefined number of bits divided by two) the frequency of core clock signal CLK.

An output line of multiplexer 402 is connected to an input terminal of a second register 404. A clock terminal of register 404 is a connected to a clock line CLK3$x$ that supplies the clock that has a frequency three times (the predefined number of bits divided by two) the frequency of core clock signal CLK.

A transmit even data line td_even connects the output terminal of register 403 to a first input terminal D1 of a double data rate register 411 in a FPGA I/O buffer 410. FIG. 7A provides a signal trace for transmit even data line td_even. A transmit odd data line td_odd connects the output terminal of register 404 to a second input terminal D2 of double data rate register 411. FIG. 7A provides a signal trace for transmit odd data line td_odd. The clock terminal of double data rate register 411 is connected to clock line CLK3$x$.

A data output terminal of double data rate register 411 is connected to an input terminal of buffer 412 that in turn drives a transmit data line TXDATA. A frame signal output terminal of double data rate register 411 is connected to a transmit frame line TXFRAME.

FIGS. 5 and 7A include a timing diagram for the double data rate signal on transmit data line TXDATA that is connected to one of the serial links between serializer 331 and deserializer 332. In FIG. 5, clock signal CLK3$x$ has a frequency three times the frequency of core clock signal CLK. Herein, for convenience, the same reference numeral is used for a line and the signal on that line. For serializer unit 400, the data on line CORE_TXD are grouped in a set of six lines, e.g., a first set D0[5:0], a second set D1[5:0], a third set D2[5:0], etc.

The serial data (FIGS. 5 and 7A) on line TXDATA is identified by the particular bit in the data set, e.g. D0[0], D0 [1], D0[2], etc. Thus, six bits of data from the ASIC block are multiplexed and retimed in the three times the core clock frequency domain. The retimed signals are fed to the double date rate register 411. The frame signal on line TXFRAME is sent to the receiver along with the high-speed data from line TXDATA for synchronization purposes. The number of serializer units that can be bundled together to form a serializer is not limited because all the serializer units use the same transmission clock.

Figure 6:
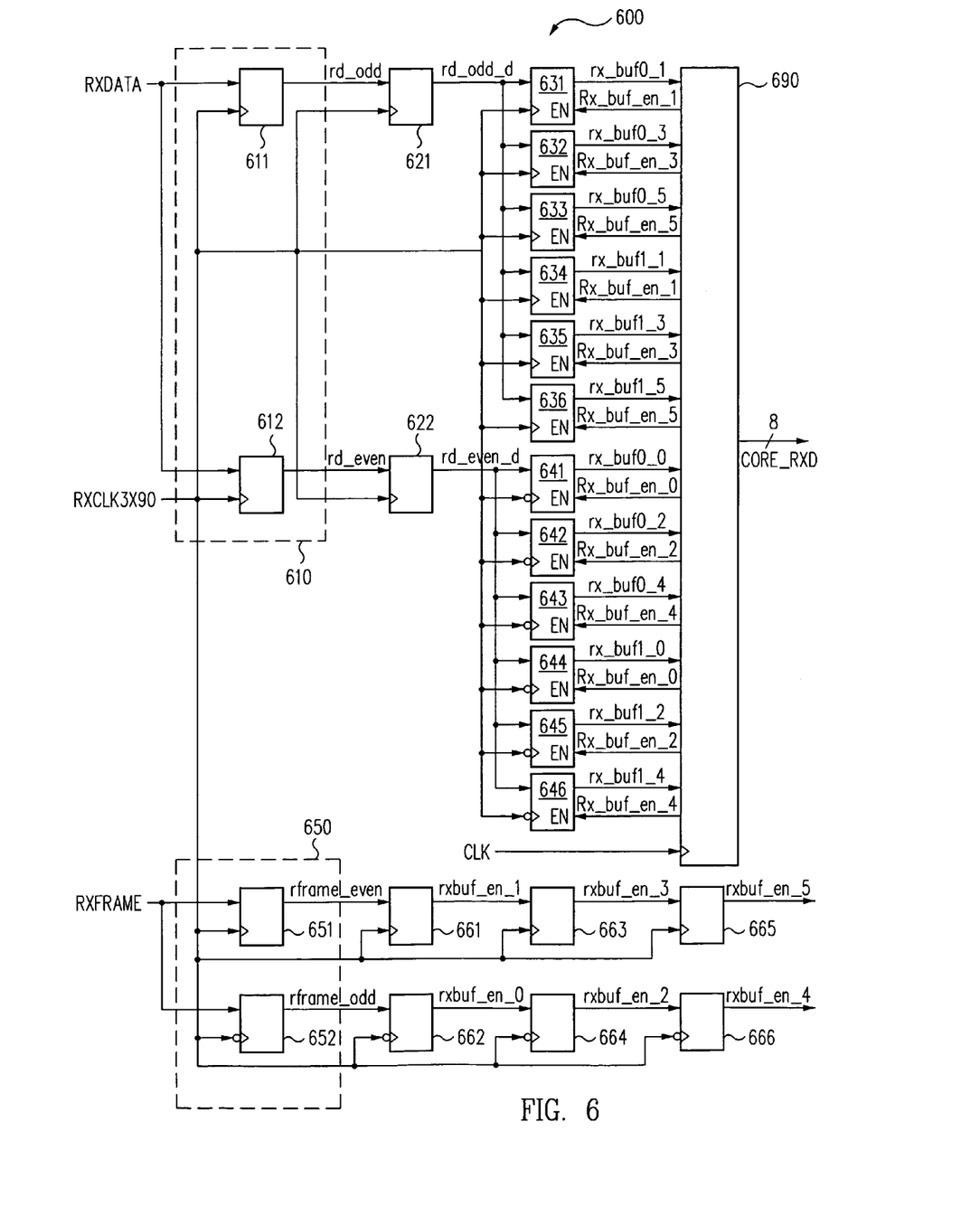
FIG. 6 is a schematic of a deserializer unit that can be used in FIGS. 2 and 3 according to one embodiment of the present invention.

FIG. 6 is a more detailed diagram of one embodiment of a deserializer unit, sometimes called a receiver unit, according to one embodiment of the present invention. In this example, deserializer unit 600 receives a received frame signal RXFRAME (FIG. 7A) on line RXFRAME. (Herein, a signal having a particular reference numeral is carried on a line having the same reference numeral. Accordingly, when a signal is described those of skill in the art understand that that signal is carried on a corresponding line with the same reference numeral.)

Received frame signal RXFRAME corresponds to a transmitted frame signal TXFRAME. Deserializer unit 600 also receives a data signal RXDATA (FIG. 7A) that corresponds to transmitted data signal TXDATA that was described above.

A received clock line (not shown) receives a clock signal RXCLK3$x$ (FIG. 7A) that is associated with clock signal CLK3$x$ that has a frequency three times (the predefined number of bits divided by two) the frequency of core clock signal CLK (See FIG. 7A also). In this example, it is assumed that there is no clock skew caused by the traces on the printed circuit board. Consequently, received clock signal RXCLK3$x$ and received data signal RXDATA are perfectly lined up at receiver 600.

However, receiver 600 needs to sample the data in the middle of the data "eyes." Accordingly, received clock signal RXCLK3$x$ is phase shifted by 90° to create a ninety-degree phase shifted clock RXCLK3$x$90 (FIG. 7A).

Ninety-degree phase shifted clock RXCLK3$x$90 (FIG. 6) is applied to a clock terminal of a first dual data rate register 610 in an input/output block of the FPGA. Clock RXCLK3$x$90 is applied to a clock terminal of a first register 611 in dual data rate register 610 and to an inverter on a clock terminal of a second register 612 in dual data rate register 610.

Received data signal RXDATA (FIG. 6) is applied to an input terminal of register 610 and to an input terminal of register 611. A received data odd signal rd_odd (FIGS. 6 and 7A) from the output terminal of register 611 is applied to an input terminal of an odd retiming register 621. A received data even signal rd_even (FIGS. 6 and 7A) from the output terminal of register 612 is applied to an input terminal of an even retiming register 622. Ninety-degree phase shifted clock RXCLK3$x$90 also is applied to a clock terminal of register 621 and to an inverter on a clock terminal of register 622.

A signal rd_odd_d (FIGS. 6 and 7B) from the output terminal of register 621 is applied to an input terminal of each of a plurality of six registers 631 to 636. Ninety-degree phase shifted clock RXCLK3$x$90 also is applied to a clock terminal of each of the plurality of registers 631 and 636.

Figure 7B:
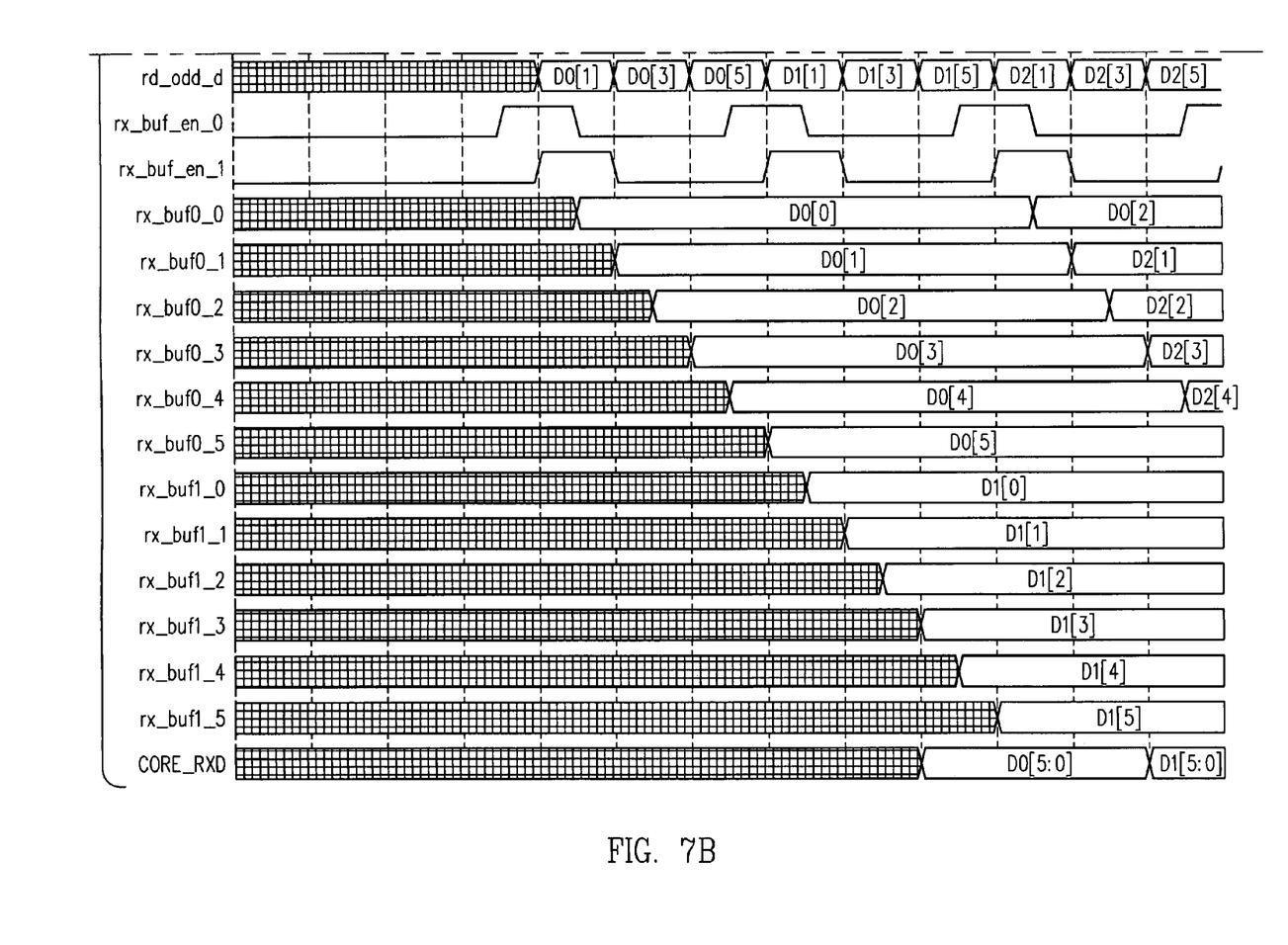

Each of the plurality of registers 631 to 636 has a clock enable terminal EN. Clock enable terminal EN of register 631 and clock enable terminal EN of register 634 receive a receive buffer enable signal rxbuf_en_1 (FIGS. 6 and 7B). Clock enable terminal EN of register 632 and clock enable terminal EN of register 635 receive a receive buffer enable signal rxbuf_en_3 (FIG. 6). Clock enable terminal EN of register 633 and clock enable terminal EN of register 636 receive a receive buffer enable signal rxbuf_en_5 (FIG. 6).

A signal rd_even_d (FIGS. 6 and 7A) from the output terminal of register 622 is applied to an input terminal of each of a plurality of six registers 641 to 646. Ninety-degree phase shifted clock RXCLK3$x$90 also is applied to an inverter on a clock terminal of each of the plurality of registers 641 and 646.

Each of the plurality of registers 641 to 646 has a clock enable terminal EN. Clock enable terminal EN of register 641 and clock enable terminal EN of register 644 receive a receive buffer enable signal rxbuf_en_0 (FIGS. 6 and 7B).

Clock enable terminal EN of register 642 and clock enable terminal EN of register 645 receive a receive buffer enable signal rxbuf_en_2 (FIG. 6). Clock enable terminal EN of register 643 and clock enable terminal EN of register 646 receive a receive buffer enable signal rxbuf_en_4 (FIG. 6).

Output signal rx_buf0_1 (FIGS. 6 and 7B) from register 631 is applied to a first input terminal of element 690. Output signal rx_buf0_3 (FIGS. 6 and 7B) from register 632 is applied to a second input terminal of element 690. Output signal rx_buf0_5 (FIGS. 6 and 7B) from register 633 is applied to a third input terminal of element 690.

In one embodiment, element 690 includes a multiplexer with twelve input terminals. The multiplexer passes the signals on a selected set of input terminals to a six-bit register set of element 690 that in turn is connected to line CORE_RXD that includes six lines.

Output signal rx_buf1_1 (FIGS. 6 and 7B) from register 634 is applied to a fourth input terminal of element 690. Output signal rx_buf1_3 (FIGS. 6 and 7B) from register 635 is applied to a fifth input terminal of element 690. Output signal rx_buf1_5 (FIGS. 6 and 7B) from register 636 is applied to a sixth input terminal of element 690.

Output signal rx_buf0_0 (FIGS. 6 and 7B) from register 641 is applied to a seventh input terminal of element 690. Output signal rx_buf0_2 (FIGS. 6 and 7B) from register 642 is applied to an eight input terminal of element 690. Output signal rx_buf0_4 (FIGS. 6 and 7B) from register 643 is applied to a ninth input terminal of element 690.

Output signal rx_buf1_0 (FIGS. 6 and 7B) from register 644 is applied to a tenth input terminal of element 690. Output signal rx_buf1_2 (FIGS. 6 and 7B) from register 645 is applied to an eleventh input terminal of element 690. Output signal rx_buf1_4 (FIGS. 6 and 7B) from register 646 is applied to a twelfth input terminal of element 690. Core clock signal CLK is applied to a clock terminal of element 690.

Ninety-degree phase shifted clock RXCLK3x90 is applied to a clock terminal of a second dual data rate register 650 in an input/output block of the FPGA. Clock RXCLK3x90 is applied to a clock terminal of a first register 651 in dual data rate register 650 and to an inverter on a clock terminal of a second register 652 in dual data rate register 650. Clock RXCLK3x90 also is applied to a clock terminal of a register 661, to a clock terminal of a register 662, to a clock terminal of a register 663, to a clock terminal of a register 664, to a clock terminal of a register 665, and to a clock terminal of a register 666.

Received frame signal RXFRAME (FIGS. 6 and 7A) is applied to an input terminal of register 650 and to an input terminal of register 651. A received frame even signal rframe_even (FIGS. 6 and 7A) from the output terminal of register 651 is applied to an input terminal of a register 661. A received frame odd signal rframe_odd (FIGS. 6 and 7A) from the output terminal of register 652 is applied to an input terminal of a register 662.

Signal rx_buf_en_1 (FIGS. 6 and 7B) is supplied from the output terminal of register 661 and is applied to an input terminal of a register 663. Signal rx_buf_en_3 (FIG. 6) is supplied from the output terminal of register 663 and is applied to an input terminal of a register 665. Signal rx_buf_en_5 (FIG. 6) is supplied from the output terminal of register 665.

Signal rx_buf_en_0 (FIGS. 6 and 7B) is supplied from the output terminal of register 662 and is applied to an input terminal of a register 664. Signal rx_buf_en_2 (FIG. 6) is supplied from the output terminal of register 664 and is applied to an input terminal of a register 666. Signal rx_buf_en_4 (FIG. 6) is supplied from the output terminal of register 665.

FIG. 7 is a key to FIGS. 7A and 7B, which are a timing diagram of deserializer unit 600 and serializer unit 400. Ninety-degree phase shifted clock RXCLK3x90 is used to clock data in received data signal RXDATA into double data rate register 610, and to clock data in received frame signal RXFRAME into double data rate register 650. Two bits of data, e.g., bits D0[0] and D0[1], are captured per clock, one from a positive edge of ninety-degree phase shifted clock RXCLK3x90 and one from a negative edge of ninety-degree phase shifted clock RXCLK3x90. The two bits of captured data on lines rd_even and rd_odd are timed using positive and negative edges. The negative edge retimed data is then registered again on the next negative edge of clock RXCLK3x90, along with previously positive edge triggered data. Clock CLK is used to demultilplex these two bits onto lines in six lines of data CORE_RXD.

The number of deserializer units 600 that can be bundled together depends on the skew control on the printed circuit board. All received serial data streams that are bundled together should have matched trace lengths on the printed circuit board.

The serial COM wrappers introduce an extra signal delay. To compensated for this extra signal delay, the ASIC block design accommodates this extra signal delay when interfacing other ASIC blocks. To avoid touching the internal logic in the ASIC blocks, in one embodiment, the ASIC block design is configurable or programmable to handle variable signal delays in either the prototyping or ASIC environment.

Subject to the limitations described above, the partitioning method is scalable based on the particular prototyping environment. Multiple pairs of serializer and deserializer units can be bundled together to form wider serial links if more ASIC signals need to be sent across PCB traces from one FPGA to another FPGA.

This disclosure provides exemplary embodiments of the present invention. The scope of the present invention is not limited by these exemplary embodiments. Numerous variations, whether explicitly provided for by the specification or implied by the specification, may be implemented by one of skill in the art in view of this disclosure.

I claim:

1. A method for application specific integrated circuit prototyping comprising:
   programming a first block of said application specific integrated circuit in a first programmable logic device wherein said first block generates a plurality of parallel output signals;
   programming a second block of said application specific integrated circuit in a second programmable logic device;
   using a first serial COM wrapper, in said first programmable logic device, to convert said plurality of parallel output signals to a serial data stream; and
   using a second serial COM wrapper, in said second programmable logic device, to convert said serial data stream to said plurality of parallel output signals.

2. The method of claim 1 further comprising:
   using a plurality of n serializer units in said first COM wrapper, wherein each serializer unit in said plurality of n serializer units processes a different set of output signals in said plurality of parallel output signals to create a serial data stream so that a plurality of n serial data streams are created, wherein n is an integer.

3. The method of claim 2 further comprising:
using a plurality of n deserializer units in said second COM wrapper, wherein each deserializer unit in said plurality of n deserializer units processes a different serial data stream in said plurality of n serial data streams.

4. The method of claim 1 wherein said first programmable logic device is a field programmable gate array, and said second programmable logic device is another field programmable gate array.

5. A structure comprising:
a printed circuit board;
a first programmable logic device, coupled to said printed circuit board, comprising:
  a pin; a
  a block of an application specific integrated circuit being prototyped wherein said block generates a plurality of output signals wherein said block of said application specific integrated circuit was programmed in said first programmable logic device; and
  a serial COM wrapper coupled to said block to receive a plurality of parallel output signals, and coupled to said pin;
a second programmable logic device, coupled to said printed circuit board, comprising:
  another pin;
  another block of said application specific integrated circuit being prototyped wherein said another block of said application specific integrated circuit was programmed in said first programmable logic device; and
  another serial COM wrapper coupled to said another block to provide a plurality of parallel input signals, and coupled to said another pin; and
a trace on said printed circuit board coupling said pin to said another pin.

6. The structure of claim 5 wherein said serial COM wrapper comprises:
at least one serializer unit.

7. The structure of claim 5 wherein said serial COM wrapper comprises:
a plurality of serializer units wherein each serializer unit is coupled to receive a different set of output signals in said plurality of output signals.

8. The structure of claim 5 wherein said another serial COM wrapper comprises:
at least one deserializer unit.

9. The structure of claim 5 wherein said another serial COM wrapper comprises:
a plurality of deserializer units wherein each deserializer unit is coupled to receive a different serial data stream.

10. The structure of claim 5 wherein said first programmable logic device is a field programmable gate array, and said second programmable logic device is another field programmable gate array.

* * * * *